United States Patent [19]

Hsieh

[11] Patent Number: 4,902,910

[45] Date of Patent: Feb. 20, 1990

[54] POWER SUPPLY VOLTAGE LEVEL SENSING CIRCUIT

[75] Inventor: Hung-Cheng Hsieh, Sunnyvale, Calif.

[73] Assignee: Xilinx, Inc., San Jose, Calif.

[21] Appl. No.: 121,962

[22] Filed: Nov. 17, 1987

[51] Int. Cl.[4] .................... H03K 3/01; H03K 5/153; H03K 5/159

[52] U.S. Cl. .................... 307/296.4; 307/296.5; 307/350; 307/363

[58] Field of Search .................... 307/350, 363, 296 R

[56] References Cited

U.S. PATENT DOCUMENTS 4,697,097 9/1987 Rusznyak .................... 307/350

Primary Examiner—Stanley D. Miller
Assistant Examiner—M. R. Wambach
Attorney, Agent, or Firm—Skjerven, Morrill, MacPherson, Franklin & Friel

[57] ABSTRACT

A power supply voltage level sensing circuit on an integrated circuit generates a reset signal that holds the components of the integrated circuit in a defined state when the power supply voltage level drops below a predetermined voltage. The reset signal is released when the power supply voltage level returns to above the predetermined voltage.

The voltage level sensing circuit is comprised of two inverters and a filter circuit. The inverters start to conduct at different power supply voltage levels and have different trigger point characteristics.

The power supply voltage level sensing circuit may be coupled with a power-on reset circuit to create a voltage sensing power-on reset circuit which generates a reset signal not only when the power supply voltage is first supplied to the circuit, but also when the power supply voltage level temporarily falls below a selected value.

49 Claims, 6 Drawing Sheets

FIG. 1
PRIOR ART

CIRCUIT ELEMENT 4-1   CIRCUIT ELEMENT 4-2

POWER SUPPLY VOLTAGE LEVEL SENSING CIRCUIT

BACKGROUND OF THE INVENTION

1. Field of the Invention

This invention relates generally to power-on reset circuits and more specifically to a power supply voltage level sensing circuit which, when coupled with a power-on reset circuit, creates a voltage sensing power-on reset circuit which generates a reset signal not only when the power supply voltage is first applied to the circuit, but also when the power supply voltage level falls below a selected value.

2. Description of Prior Art

Integrated circuits typically contain bistable components such as registers, flip-flops, latches and memory elements. When the power supply voltage is applied to a circuit containing such components, the initial state of the components, and hence the circuit, depends upon the rise time of the power supply voltage and the threshold voltages of the transistors comprising the components. Accordingly, most integrated circuits include a power-on reset circuit to initialize the various components when power is first applied to the circuit.

Some circuit components, such as logic elements and flip-flops, require a certain amount of time to reach a stable operating condition after receipt of a reset signal. Thus, the power-on reset circuit maintains an output signal at a first level for a period of time sufficient to allow the circuit components to stabilize and then the output signal is switched to a second level, complementary to the first level, and maintained at the second level for as long as power is applied to the circuit.

Figure 1:
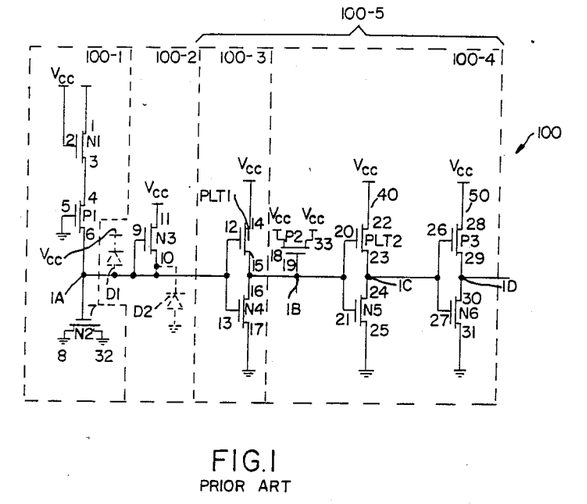
FIG. 1 shows a prior art power-on reset circuit which has hysteresis.

FIG. 1 shows a prior art CMOS power-on reset circuit 100. The power-on reset circuit 100 is compatible with integrated circuits having a wide range of power supply voltage rise times Power-on reset circuit 100 includes initializing buffer 100-5, delay circuit 100-1, and discharge circuit 100-2 Initializing buffer 100-5 includes input (secondary) inverter 100-3 and initializing circuit 100-4.

Initializing circuit 100-4 includes the P-channel enhancement mode transistor P2 and initializing inverters 40, 50. Inverter 40 comprises an unimplanted P channel enhancement mode transistor PLT2 and an N channel enhancement mode transistor N5. Similarly, inverter 50 comprises P channel enhancement mode transistor P3 and N channel enhancement mode transistor N6.

The drain 18 and source 33 of transistor P2 are connected to the positive power supply voltage $V_{CC}$ and the gate 19 of transistor P2 is connected to node 1B. Gates 20 and 21 of transistors PLT2 and N5, respectively, are also connected to node 1B. Source 22 of transistor PLT2 and source 28 of transistor P3 are connected to the power supply voltage $V_{CC}$ and source 25 of transistor N5 and source 31 of transistor N6 are connected to ground. Drains 23 and 24 of transistors PLT2 and N5, respectively, are connected to node 1C. Gates 26 and 27 of transistors P3 and N6, respectively, are also connected to node 1C. Drains 29 and 30 of transistors P3 and N6, respectively, are connected to output node 1D.

Input (secondary) inverter 100-3 comprises unimplanted P channel enhancement mode transistor PLT1 and N channel enhancement mode transistor N4. Gates 12 and 13 of transistors PLT1 and N4, respectively, are connected to node 1A, and drains 15 and 16 of transistors PLT1 and N4, respectively, are connected to node 1B. Source 14 of transistor PLT1 is connected to power supply voltage $V_{CC}$ and source 17 of transistor N4 is connected to ground.

Delay circuit 100-1 includes N channel enhancement mode transistor N1 and P channel enhancement mode transistor P1. Gate 2 and drain 1 of transistor N1 are connected to $V_{CC}$ and source 3 of transistor N1 is connected to the source 4 of transistor P1. Gate 5 of transistor P1 is connected to ground and drain 6 of transistor P1 and gate 7 of N channel enhancement mode transistor N2 are connected to node 1A, while the source 8 and the drain 32 of transistor N2 are connected to ground.

Discharge circuit 100-2 includes two parasitic diodes and an N channel enhancement mode transistor N3. The first parasitic diode D1, whose anode is connected to node 1A and whose cathode is connected to the power supply voltage $V_{CC}$, represents the parasitic diode between the drain and the substrate of transistor P1. The second parasitic diode D2, whose anode is connected to ground and whose cathode is connected to the source of N channel transistor N3, represents the junction diode between source 10 and the substrate of N channel transistor N3. Drain 11 of transistor N3 is connected to power supply voltage $V_{CC}$. Gate 9 and source 10 of transistor N3 are connected to node 1A.

The operation of a power-on reset circuit, similar to power-on reset circuit 100, is described in copending patent application Ser. No. 06/841,910 entitled "CMOS Power-on Reset Circuit", by John Mahoney, now U.S. Pat. No. 4,746,822, issued May 24, 1988, which is incorporated herein by reference. Briefly, the power-on reset signal is the output signal at node 1D of initializing buffer 100-5. This output signal assumes a first constant value as soon as the magnitude of the power supply voltage $V_{CC}$ rises above the level of the threshold voltage of transistor P3. The output signal of the initializing buffer 100-5 remains at the first constant value for a selected period of time sufficient to enable the components in the integrated circuit containing the power-on reset circuit 100 to stabilize. After the selected time period, the power-on reset circuit switches the output signal at node 1D to a second constant value.

The transistors N1 and P1 in delay circuit 100-1 do not conduct until the power supply voltage $V_{CC}$ has risen above the sum of the absolute value of the threshold voltages of transistors N1 and P1 which is a voltage level higher than the threshold voltage of transistor P3. The time required for the supply voltage to rise from the threshold voltage of transistor P3 to the level required to turn-on the transistors N1 and P1 constitutes one portion of the selected time period. A second portion of the selected time period is provided by the capacitance of transistor N2 in conjunction with the resistance provided by the transistors N1 and P1. This RC network also delays the rise of the voltage level on node 1A for a selected period of time. When the voltage on node 1A rises above the trigger point of inverter 100-3, the output signal of inverter 100-3 goes low, which in turn forces the output signal of the initializing buffer 100-5 to its second constant value.

The CMOS power-on reset circuit 100 in FIG. 1 is suitable for use with a power supply voltage that rises slowly (DC sweep), with a power supply voltage that rises to one-half of its maximum value in less than 100 nanoseconds, or with a power supply voltage having an intermediate rise time. The power-on reset circuit 100 does not respond to changes in the power supply voltage level after the reset signal is released, i.e., after the output signal of the initializing buffer 100-5 changes to its second constant value, and the circuit 100 maintains the second constant value output signal until the power supply voltage level drops to ground.

Figure 2:
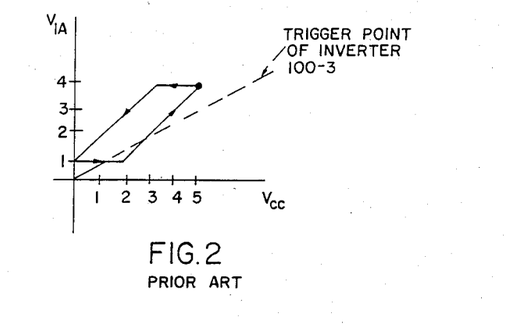
FIG. 2 illustrates the hysteresis characteristic of the prior art power-on reset circuit of FIG. 1.

The response of circuit 100 to changes in the power supply voltage level after the circuit generates the second constant value output signal is shown in FIG. 2. The power supply voltage level $V_{CC}$ is plotted on the abscissa in FIG. 2, and the voltage at node 1A is plotted on the ordinate. The dotted line in FIG. 2 represents the variation of the trigger point of inverter 100-3 with the power supply voltage level $V_{CC}$. The steady-state voltage at node 1A is the steady state power supply voltage level $V_{CC}$, assumed to be +5 volts, minus the threshold voltage $V_T$ of transistor N1, assumed to be 1 volt. Accordingly, in FIG. 2, the steady-state voltage at node 1A is shown as 4 volts for a $V_{CC}$ of 5 volts.

As the power supply voltage level $V_{CC}$ decreases, the voltage at node 1A remains constant, as shown by the upper solid line in FIG. 2, because transistor N3 does not start to discharge the capacitor created using transistor N2 until the power supply voltage level falls to $V_{CC}$ minus 2 $V_T$. Here, the threshold voltages $V_T$ of all N channel enhancement transistors in circuit 100 are assumed equal. As the power supply voltage level decreases from $V_{CC}$ minus 2 $V_T$, transistor N3 turns on and discharges the capacitor so that the voltage at node 1A decreases linearly and continues to decrease to the value $V_T$ when the power supply voltage level reaches zero volts. During the linear decrease of the voltage at node 1A, the output signal at node 1D remains constant because the voltage at node 1A remains above the trigger point, represented by the dotted line in FIG. 2, of the inverter 100-3.

As the power supply voltage level increases from zero volts, the transistor N3 turns off and the capacitor will not start to charge until the power supply voltage is equal to twice the threshold voltage of N channel enhancement mode transistor. However, this assumes that the absolute value of the threshold voltage of transistor P1 is less than the threshold voltage of transistor N3. If the absolute value of the threshold voltage of transistor P1 is greater than the threshold voltage of transistor N3, the capacitor will not start to charge until the power supply voltage level is the sum of the absolute value of the threshold voltages of transistors N1 and P1. The increasing voltage at node 1A crosses the trigger point of the inverter 100-3, and the output signal of inverter 100-3 goes low, which in turn forces the output signal on node 1D of the initializing buffer 100-5 to its second constant value.

The hysteresis characteristic, illustrated in FIG. 2, of the power-on reset circuit 100 is desirable because the circuit 100 does not reset the components in the integrated circuit containing the power-on reset circuit 100 for minor power supply level variations. However, when the power supply voltage $V_{CC}$ drops below 3.5 to 4 volts, the operation of the memory components, flip-flops and similar components become unreliable. Consequently, the function of the integrated circuit is also unreliable when the power supply voltage level drops below 3.5 to 4 volts. The necessity of taking the power supply voltage $V_{CC}$ level all the way to ground, as required by the circuit of FIG. 1 and as shown in FIG. 2, to generate a reset signal, i.e. a signal which holds the integrated circuit containing the power-on reset circuit 100 in a known state, is undesirable. Accordingly, a means for generating a reset signal when the power supply voltage level falls below a selected value, but not all the way to zero, is desirable because the reset signal holds the integrated circuit in a known state until such time as the power supply voltage level returns to a level where the integrated circuit functions reliably.

Figure 3:
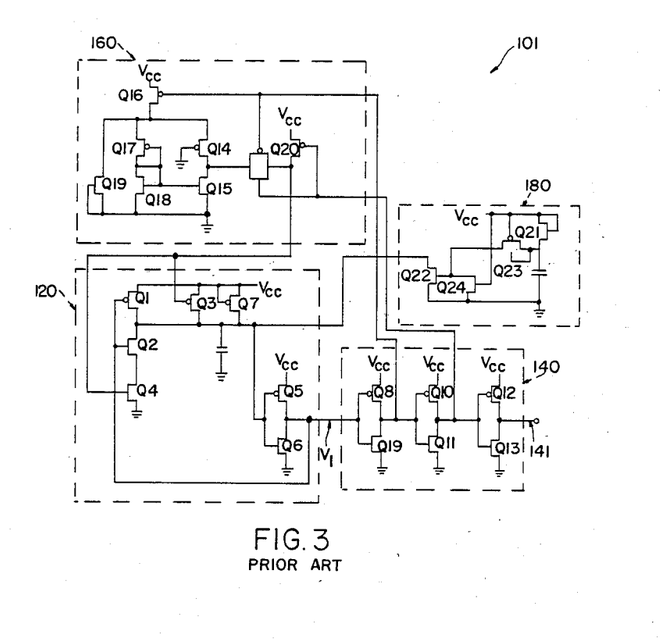
FIG. 3 is a schematic drawing of a prior art power-on reset circuit which generates a reset signal when the power supply voltage level falls below a selected value.

Another prior art power-on reset circuit 101, shown in FIG. 3, uses a latch 120 to generate a reset signal when the power supply voltage is first supplied to the circuit, and also to generate a reset signal when the power supply voltage falls below a selected value, i.e., the threshold voltage of the field effect transistors in the power-on reset circuit 101. As shown in FIG. 3, power-on reset circuit 101 is comprised of a threshold detection circuit 160, a transient power supply voltage protection circuit 180, a latch 120, and a delay circuit 140. Latch 120 is a preferential cross-coupled latch of well known design and always powers up in the preferred state because of the geometries of the CMOS transistors comprising the latch 120.

The power-on reset circuit 101 generates a reset signal on the output terminal 141 when the power is initially applied to the integrated circuit which contains the power-on reset circuit 101. A reset signal is also generated whenever the power supply voltage level drops below the threshold voltage.

When power is initially applied to circuit 101, the power supply voltage level rises from 0 volts to 5 volts and as the power supply voltage level passes the threshold voltage, latch 120 activates in a known state. When latch 120 turns on, the output voltage signal $V_1$ from latch 120 is transmitted to delay circuitry 140. After a time delay, the signal on the output terminal 141 is set to a first known state, which is a function of the voltage signal $V_1$. The signal on output terminal 141 holds the remainder of the circuitry in the integrated circuit in a known power up state.

The integrated circuit containing circuit 101 is not rendered operational until the power supply voltage has reached approximately its nominal operating value. The threshold detection circuitry 160 resets latch 120 when the power supply voltage reaches a level greater than twice the threshold voltage. After latch 120 changes state, the signal on output terminal 141 changes to a second known state, complementary to the first known state, after a suitable delay determined by the delay circuit 140.

Latch 120 is designed so that the power-on reset circuitry will not generate another reset pulse unless the power supply voltage level drops below the threshold voltage. Thus, minor variations in the power supply voltage, which have no effect on proper operation of the integrated circuit, do not cause a reset pulse to be generated. When the power supply voltage level drops below the threshold voltage for only a short period, latch 120 may power up in a non-preferred state. This is prevented by the transient protection circuit 180. Transient protection circuitry 180 automatically drains off stored charge within latch 120 whenever the power supply voltage drops below the threshold voltage $V_T$. This ensures that latch 120 powers up in the preferred state after a short transient.

While circuit 101 in FIG. 3 provides a means for resetting the components on an integrated circuit after a power supply voltage transient, the circuit has several undesirable features. The circuit does not generate a reset pulse until the power supply voltage level has fallen to the threshold voltage. As noted previously, most integrated circuits become unreliable when the power supply voltage level falls to the range of 3.5 to 4 volts which is considerably above the threshold voltage of a typical MOS transistor. Further, the function of the circuit 101 depends upon the specially designed latch 120, as shown in FIG. 3, and therefore this power-on reset circuit is not suitable for use with a power-on reset circuit such as that shown in FIG. 1. Accordingly, a means, which may be incorporated with any power-on reset circuit, is needed for sensing the power supply voltage level and generating a reset signal both when the power is first applied and when the power supply voltage level decreases below a selected value.

SUMMARY OF THE INVENTION

This invention provides a CMOS power supply voltage level sensing circuit which generates a reset signal that holds the components of the integrated circuit containing the power supply voltage level sensing circuit in a defined state when the power supply voltage level drops below a predetermined voltage. The reset signal is released when the power supply voltage level exceeds the predetermined voltage.

The voltage level sensing circuit is comprised of two inverters and a filter circuit. The inverters start to conduct at different power supply voltage levels and have different trigger point characteristics.

A first inverter comprising four transistors: a P channel enhancement mode transistor connected in series with a P channel pull-up transistor and an N channel enhancement mode transistor connected in series with an N channel pull-down transistor. The input and output terminals of the first inverter are tied together. The second inverter is comprised of a CMOS inverter having an unimplanted P channel enhancement mode pull-up transistor and an N channel pull-down transistor.

The power supply voltage level at which the first inverter starts to conduct is determined by the threshold voltage of the P channel enhancement mode transistors. The power supply voltage level at which the second inverter starts to conduct is determined by the threshold voltage of the unimplanted P channel enhancement mode pull-up transistor. Since the threshold voltage of the unimplanted P channel enhancement mode transistor is greater than the threshold voltage of the P channel enhancement mode transistors, the first inverter starts to conduct before the second inverter.

The trigger point for a CMOS inverter is the minimum voltage that must be applied on the input terminal of the inverter for a specified power supply voltage level so as to cause the inverter to change its output signal level. The trigger point characteristic of the first inverter is determined by the width to length ratio of the P channel pull-up transistor and the width to length ratio of the N channel pull-down transistor. The transistors are designed so that the width to length ratio of the pull-down transistor is at least 100 times greater than the width to length ratio of the pull-up transistor.

With the special design of the pull-up and pull-down transistor in the first inverter, the trigger points of the first and second inverter cross at a predetermined voltage. For power supply voltage levels less than the predetermined voltage, the trigger point of the first inverter is greater than the trigger point of the second inverter. For power supply voltage levels greater than the predetermined voltage, the trigger point of the second inverter is greater than the trigger point of the first inverter. Accordingly, when the output signal of the first inverter is supplied to the input terminal of the second inverter, the output signal from the second inverter is a first level if the power supply voltage level is greater than the predetermined voltage, and a second level if the power supply voltage level is less than the predetermined voltage. This unique combination of inverters provides a means for determining the level of the power supply voltage.

However, since the inverters will change state even when the power supply voltage level drops only momentarily below the predetermined voltage level, a filter circuit is coupled to the output terminal of the second inverter to prevent momentary drops in the power supply voltage from resetting the circuit. The filter circuit generates an output signal and thus a power on reset signal to reset the circuit only when the output signal from the second inverter remains at a specified level for at least a time determined by the filter circuit.

The power supply voltage level sensing circuit of my invention may be coupled with a CMOS power-on reset circuit to create a voltage sensing power-on reset circuit which generates a reset signal not only when the power supply voltage is first supplied to the circuit, but also when the power supply voltage level falls below a selected value for greater than a selected time By selecting the geometry of the transistors in the first inverter, the voltage sensing power-on reset circuit can be implemented so that a reset signal is generated whenever the power supply voltage level falls to or below an undesirable level for at least a minimum time.

DETAILED DESCRIPTION

The power supply voltage level sensing circuit of my invention is a control circuit which provides a reset signal if the power supply voltage level drops below the predetermined voltage $V_P$ for a specific period of time. The power supply voltage level sensing circuit is comprised of two circuit elements 4-1, 4-2, shown in FIG. 4, which in combination define the predetermined voltage $V_P$.

Figure 4:
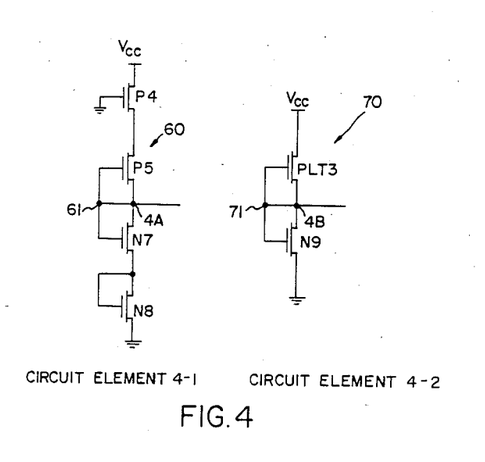
FIG. 4 illustrates the unique circuit elements of my invention.

Circuit element 4-1 is comprised of two P channel enhancement mode transistors P4, P5 and two N channel enhancement mode transistors N7, N8. The source of transistor P4 is connected to the power supply voltage $V_{CC}$ and the source of transistor N8 is connected to ground. The drain of transistor P4 is connected to the source of transistor P5 and the drain of transistor P5 is connected to node 4A. The drain of transistor N7 and the gates of transistor P5 and N7 are also connected to the node 4A. The source of transistor N7 is connected to the drain of transistor N8 as well as to the gate of transistor N8. The gate of transistor P4 is connected to ground. Circuit element 4-1 comprises an inverter 60 with the input terminal 61 tied to the output terminal 4A.

In the circuit element 4-1, the size of transistors P4, N8 is selected such that the voltage drop between the source and drain of transistor P4 is very small, and the voltage drop between the source and drain of transistor N8 is approximately a threshold voltage drop. In one embodiment, both transistor P4 and transistor N8 have a length of 1.5 microns and a width of 200 microns which gives a width to length ratio of 133.

The size of transistor N7 is chosen much larger than the size of transistor P5, i.e., the width to length ratio of transistor N7 is much greater than the width to length ratio of transistor P5. In a preferred embodiment, the width of transistor P5 is 4.5 microns while the length is 60 microns, and transistor N7 has a width of 100 microns and a length of 10 microns. The size of transistors P5 and N7 is selected so as to minimize the DC current drain of circuit element 4-1, and to create a trigger point for inverter 60, as discussed below, which increases slowly relative to the increase in the power supply voltage level.

The circuit element 4-2 is an inverter comprised of an unimplanted P channel enhancement mode transistor PLT3 and an N channel enhancement mode transistor N9. The source of transistor PLT3 is connected to the power supply voltage $V_{CC}$ and the source of transistor N9 is connected to ground. The drain of transistor PLT3, the drain of transistor N9, the gate of transistor PLT3 and the gate of transistor N9 are connected to the node 4B. For this configuration, the input terminal 71 of the inverter is tied to the output terminal 4B.

Since both circuit elements 4-1, 4-2, in FIG. 4, have the input and output terminal connected together, the voltage at the node 4A and the voltage at node 4B are the trigger points, as previously defined, for the circuit elements 4-1, 4-2 respectively. When the input terminal of a CMOS inverter is not tied to the output terminal of the inverter, the trigger point, as determined with the input and output terminal tied together, represents the minimum voltage that must be applied to the input terminal for a given power supply voltage level to cause the signal on the output terminal to change logical level. An input signal to the inverter above the trigger point for a given power supply voltage $V_{CC}$ will cause the output signal from the inverter to go low while an input signal below the trigger point for a given power supply voltage $V_{CC}$ will cause the output signal from the inverter to go high.

Figure 5:
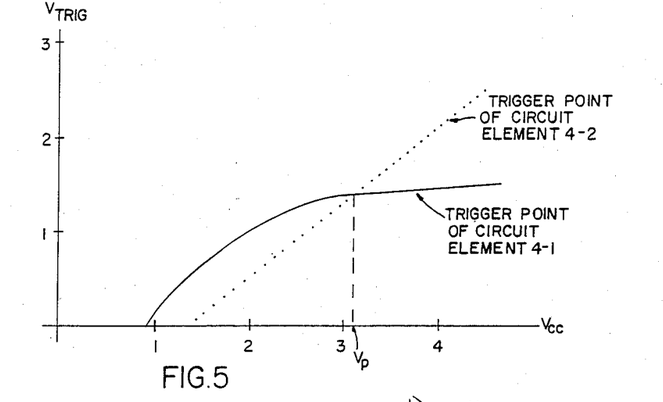
FIG. 5 illustrates the trigger point characteristics of the circuit elements of my invention.

The response of circuit elements 4-1, 4-2 to an increase in power supply voltage level $V_{CC}$, i.e., the trigger points of circuit elements 4-1, 4-2 is shown in FIG. 5. The power supply voltage level $V_{CC}$ is plotted on the abscissa and the voltage at node 4A for circuit element 4-1 and the voltage at node 4B for circuit element 4-2 are plotted on the ordinate. As shown by the solid line in FIG. 5, as the power supply voltage level increases from 0 volts, circuit element 4-1 does not conduct until the power supply voltage level rises above the threshold voltage of transistors P4 and P5. For the sizes of transistors P4, P5 cited above, the threshold voltage corresponds to a power supply voltage of approximately 0.9 volts.

As the power supply voltage level $V_{CC}$ increases above the threshold voltage, the voltage at node 4A rises and levels off at approximately 1.5 volts. The voltage rise at node 4A is determined by the relative sizes of transistors P5, N7. After transistors P5 and N7 start to conduct, they function as a voltage divider. Since the width to length ratio of transistor P5 is much smaller than the width to length ratio of transistor N7, most of the voltage drop is across transistor P5. Accordingly, as the power supply voltage increases the voltage at node 4A initially increases and then levels off. To assure that circuit element 4-1 has the trigger voltage characteristic shown in FIG. 5, the width to length ratio of transistor N7 should be at least 100 times greater than the width to length ratio of transistor P5.

The voltage for circuit element 4-2 to start to conduct is greater than the voltage for circuit element 4-1 to start to conduct because transistor PLT3 is an unimplanted P channel enhancement mode transistor. Unimplanted P channel enhancement mode transistor PLT3 has a larger threshold voltage than the threshold voltages of the P channel transistors in circuit element 4-1. Accordingly, as shown by the dotted line in FIG. 5, the circuit element 4-2 does not start to conduct until the power supply voltage reaches approximately 1.3 volts. After the 1.3 volt threshold is reached, the output voltage at node 4B rises linearly with the power supply voltage level. The trigger point for the circuit element 4-1, as indicated by the solid curve in FIG. 5, and the trigger point for the circuit element 4-2, as represented by the dotted line in FIG. 5, cross at the power supply voltage $V_P$. The voltage $V_P$ may be either increased or decreased by selecting the appropriate size of the transistors P5 and N7 in circuit element 4-1.

For power supply voltage levels less than the predetermined voltage $V_P$, the trigger point of circuit element 4-1 is greater than the trigger point of circuit element 4-2. Conversely, for power supply voltage levels greater than $V_P$, the trigger point for circuit element 4-2 is greater than the trigger point for circuit element 4-1.

Accordingly, if the input terminal 71 of circuit element 4-2 is connected to the output terminal 4A of circuit element 4-1, rather than to the output terminal of circuit element 4-2, then when the power supply voltage level is less than the predetermined voltage $V_P$, the voltage at node 4A, i.e., the trigger point of circuit element 4-1, is greater than the trigger point of circuit element 4-2 and so the voltage at the output terminal of circuit element 4-2 goes to a low level. However, when the power supply voltage level exceeds $V_P$, the output signal level at node 4A is less than the trigger point of circuit element 4-2 and so the voltage at the output terminal of circuit element 4-2 goes to a high level.

Figures 6A, 6B:
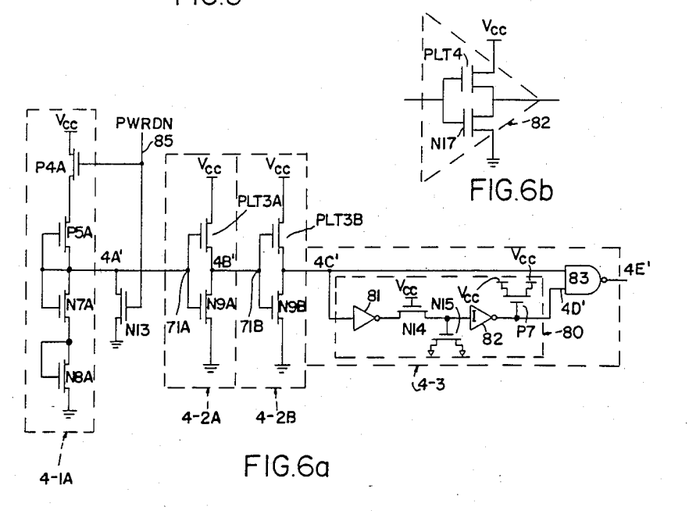
FIG. 6a is a schematic drawing of the power supply voltage level sensing circuit.
FIG. 6b is a schematic drawing of the CMOS inverter in the filter circuit of the power supply voltage level sensing circuit which has an unimplanted P channel enhancement mode pull-up transistor.

The power supply voltage level sensing circuit 90 of my invention, as illustrated in FIG. 6a, utilizes this trigger point characteristic of circuit elements 4-1 and 4-2. The power supply voltage sensing circuit 90 is comprised of the circuit element 4-1A, the circuits elements 4-2A, 4-2B and the filter circuit 4-3. The circuit 4-1A is identical to the circuit element 4-1 in FIG. 4, except the gate of transistor P4A is not tied to ground as in FIG. 4, but rather the gate is connected to the power down signal line 85. The output terminal 4A' of circuit element 4-1A is connected to the drain of the N channel enhancement mode transistor N13. The source of transistor N13 is connected to ground and the gate of transistor N13 is connected to power down signal line 85.

The circuit elements 4-2A and 4-2B no longer have the input terminal connected to the output terminal, as in FIG. 4. Rather, the input terminal 71A of circuit element 4-2A is connected to the node 4A' and the output terminal, node 4B', of circuit element 4-2A is connected to the input terminal 71B of the circuit element 4-2B. The output terminal of the circuit element 4-2B is connected to node 4C'. Circuit element 4-2B is used with circuit element 4-2A to provide additional gain. If the output signal of circuit element 4-2A does not go all the way to a logic one or a logic zero in response to a signal on the input terminal of element 4-2A, the output signal from circuit element 4-2B, in response to the output signal from circuit element 4-2A, does go completely to the correct logic level.

Node 4C' is connected to a first end of the input lead of delay circuit 80 of filter circuit 4-3 and to a first input terminal of the NAND gate 83. A second end of the input lead of delay circuit 80 is connected to the input terminal of inverter 81. The output terminal of the inverter 81 is connected to the drain of the N channel enhancement mode transistor N14 and the source of transistor N14 is connected to the gate of N channel enhancement mode transistor N15 and to the input terminal of the inverter 82. The gate of the transistor N14 is connected to the power supply voltage $V_{CC}$. The drain and the source of transistor N15 are connected to ground. The output terminal of the inverter 82 is connected to node 4D' which is also connected to a second input terminal of the NAND gate 83 and to the gate of a P channel enhancement mode transistor P7. The source and the drain of transistor P7 are connected to 32 the power supply voltage $V_{CC}$.

The transistor N14 functions as a resistive means while transistor N15 and transistor P7 function as voltage dependent capacitors. The capacitors formed by transistors N15 and P7 are called voltage dependent capacitors because if the absolute magnitude of the voltage relative to the turn-on voltage on the gate of the transistor is less than the transistor's threshold voltage, the transistor will not turn-on and therefore the delay circuit 80 sees no capacitance. However, if the absolute magnitude of the voltage relative to the turn-on voltage on the gate of the transistor is greater than the threshold voltage, the transistor turns on and the transistor effectively functions as a capacitor. Hence, transistors N15, P7 function as capacitors only for gate voltages having an absolute magnitude greater than their threshold voltages, and therefore are voltage dependent capacitors.

The inverter 82 uses an unimplanted P channel enhancement mode transistor as the pull-up transistor PLT4, as shown in FIG. 6b, to prevent steady-state current flow. A CMOS inverter has a steady-state current flow when the voltage level on the input terminal of the inverter is greater than the threshold voltage of the N channel pull-down transistor and less than the power supply voltage $V_{CC}$ minus the threshold voltage of the P channel pull-up transistor because in this range both the pull-up transistor and the pull-down transistor conduct. Hence, for a standard CMOS inverter with a P-channel enhancement mode pull-up transistor, the inverter has a DC current flow for input signal levels between 1 volt and 4 volts assuming the threshold voltage of both the pull-up transistor and the pull-down transistor is about 1 volt. Accordingly, since transistor N14 drops the voltage by one $V_T$, or 1 volt as assumed here, when a logic one passes through it, a standard CMOS inverter having the input terminal connected to transistor N14 would have a DC current flow. However, the threshold voltage of the unimplanted P channel enhancement pull-up transistor PLT4 is greater than the threshold voltage $V_T$ of transistor N14 and the input voltage level of inverter 82 when a logic one passes through transistor N14 is above the range in which the inverter 82 has a DC current flow.

In normal operation, the power down signal line 85 is connected to ground so that transistor P4A functions the same as transistor P4 in circuit element 4-1, as previously described, and transistor N13 is turned off However, when the integrated circuit containing the power supply voltage sensing circuit 90 is not in operation, a positive voltage is applied on power down signal line 85. The positive voltage turns off transistor P4A, which eliminates the DC current drain of circuit element 4-1A, and turns on transistor N13, which holds the input terminal 71A of inverter 4-2A at a logic zero signal level. Further, since the voltage level on input terminal 71A is now below the range of input voltages, as described above, for which circuit elements 4-2A has a DC current flow, the power down signal on line 85 also eliminates any DC current flow through circuit element 4-2A.

The operation of the power supply voltage level sensing circuit 90 in FIG. 6a must be divided into two regimes. In the first regime, the power supply voltage level $V_{CC}$ is less than the predetermined voltage $V_P$, and in the second regime, the power supply voltage level $V_{CC}$ is greater than predetermined voltage $V_P$. When power supply voltage level $V_{CC}$ is less than the predetermined voltage $V_P$, the trigger point of circuit element 4-1A is greater than the trigger point of the circuit elements 4-2A, 4-2B, as shown in FIG. 5. Thus, the voltage level at node 4A' is a logic high signal. The voltage level at node 4B' is a logic low signal, and the voltage level at node 4C' is a logic high signal. For the second regime, the power supply voltage level $V_{CC}$ is greater than predetermined voltage $V_P$, and the trigger point of the circuit element 4-1A is lower than the trigger point of the circuit elements 4-2A, 4-2B. For this regime, the voltage level at node 4A' is a logic low signal. The voltage at node 4B' is a logic high signal, and the voltage at node 4C' is a logic low signal. Accordingly, the output signal at node 4C' depends solely upon whether the power supply voltage level is above or below the predetermined voltage $V_P$.

The response of circuit elements 4-1A, 4-2A, 4-2B is independent of duration of the change in the power supply voltage level $V_{CC}$ and depends only on whether $V_{CC}$ is greater than or less than predetermined voltage $V_P$. As will be shown below, if the power supply voltage level only decreases momentarily, it is unnecessary to generate a reset signal because the operation of the components in the integrated circuit containing the power supply voltage sensing circuit 90 are not affected by brief dips in the power supply voltage level. However, if the power supply voltage decreases for a time period greater than the delay $t_d$ introduced by delay circuit 80 in filter 4-3 (typically about 50 to 150 nanoseconds), then operation of the components becomes unreliable and a reset signal is desirable to hold the components in a known state until the power supply voltage returns to a value greater than the predetermined voltage $V_P$. The filter circuit 4-3 in the power supply voltage level sensing circuit 90 is designed to prevent spurious reset signals when the power supply voltage level decreases momentarily (i.e. for less than the delay time $t_d$).

In the filter circuit 4-3, the signal provided at node 4C' by circuit element 4-2B is passed directly to the first input terminal of the NAND gate 83. The signal at node 4C' is also passed to the input lead of the delay circuit 80. When the power supply voltage level $V_{CC}$ decreases below the predetermined voltage $V_P$, a positive going signal is supplied to node 4C' because the signal at node 4A' is greater than the trigger point of circuit element 4-2A, as shown in FIG. 5, and accordingly the signal at node 4B' is driven low which in turn drives the signal at 4C' high. This high signal is input to inverter 81 which generates a negative going signal that is passed to the RC network comprised of transistors N14 and N15. When the second inverter 82 receives the signal, it generates a positive going signal which is delayed by the capacitor created using transistor P7. Consequently, the signal does not arrive at node 4D' until after the delay time $t_d$ of the delay circuit 80. The delay time $t_d$ is typically greater than 50 nanoseconds but less than 150 nanoseconds.

If the power supply voltage $V_{CC}$ has returned to a level greater than the predetermined voltage $V_P$ during this delay time $t_d$, the signal at node 4C' is low when the high signal arrives at the node 4D'. Thus, the output signal from NAND gate 83 remains high. However, if the power supply voltage level remains below the predetermined voltage $V_P$ longer than the delay time $t_d$ of delay circuit 80, then the signals on both input terminals of NAND gate 83 go high and the output signal from the NAND gate 83 goes low. The power supply voltage level sensing circuit generates a reset pulse only if the power supply voltage falls below the predetermined voltage $V_p$ for a time greater than the delay time $t_d$ of delay circuit 80 as determined by the output signal from NAND gate 83 going low.

When the power supply voltage level $V_{CC}$ is increasing above the predetermined voltage $V_p$, a negative going (i.e. low) signal is generated at node 4C' because the signal on node 4A' goes low relative to the signal on node 4B' and the low signal at node 4C' causes the output signal of NAND gate 83 to go high without any delay. Thus, when the power supply voltage level $V_{CC}$ is increasing above $V_P$ the filter circuit 4-3 does not delay the reset signal.

Figure 7:
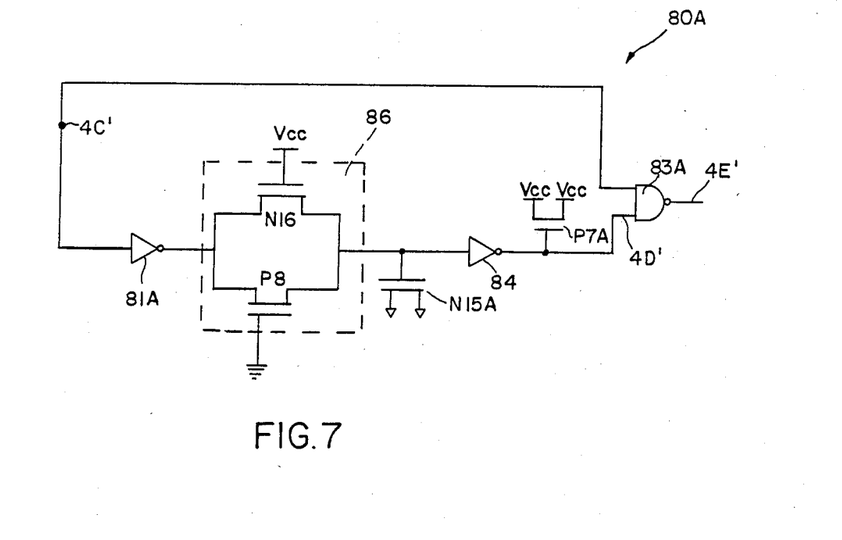
FIG. 7 illustrates an alternate embodiment of the delay circuit in the power supply voltage level sensing circuit.

The embodiment of the delay circuit 80 shown in FIG. 6a is only one means of generating a time delay. In another embodiment, shown in FIG. 7, a transmission gate 86 is used in place of the pass transistor N14. Transmission gate 86 does not cause a threshold voltage $V_T$ drop when a logic one signal passes through gate 86. Thus, the inverter 82 having unimplanted P channel enhancement mode pull-up transistor PLT4, in FIG. 6b, is replaced with a standard CMOS inverter 84 in Fig 7 because the voltage level of the output signal from transmission gate 86 when transmission gate 86 passes a logic one signal is greater than the maximum voltage for which a standard CMOS inverter has a DC current flow, as described previously.

Figure 8:
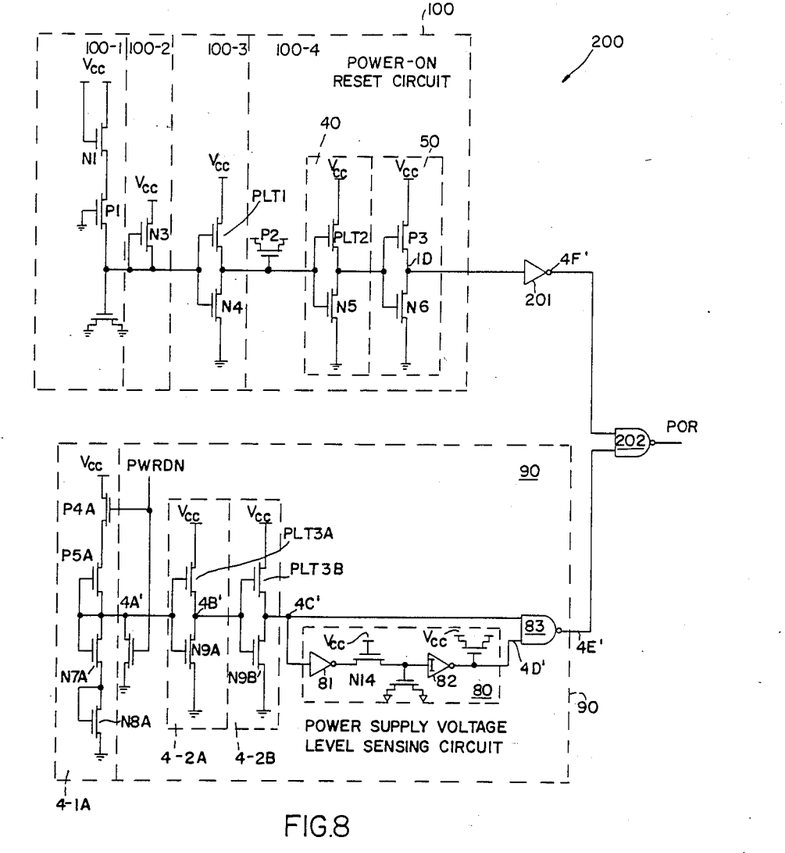
FIG. 8 is a schematic drawing of a level sensing power-on reset circuit.

The power supply voltage sensing circuit 90 of my invention may be combined with a power-on reset circuit to create a voltage sensing power-on reset circuit. For example, FIG. 8 illustrates a voltage sensing power-on reset circuit 200 comprised of the prior art power-on reset circuit 100 in FIG. 1 and the power supply voltage sensing circuit 90 in FIG. 6a. The output terminal 1D of the power-on reset circuit 100 is connected to the input terminal of the inverter 201 and the output terminal, node 4F', of the inverter 201 is connected to a first input terminal of the NAND gate 202. The output terminal 4E' of the power supply voltage level sensing circuit 90 is connected to a second input terminal of the NAND gate 202. The output terminal of the NAND gate 202 is the output terminal POR of the voltage sensing power-on reset circuit 200.

Figure 9:
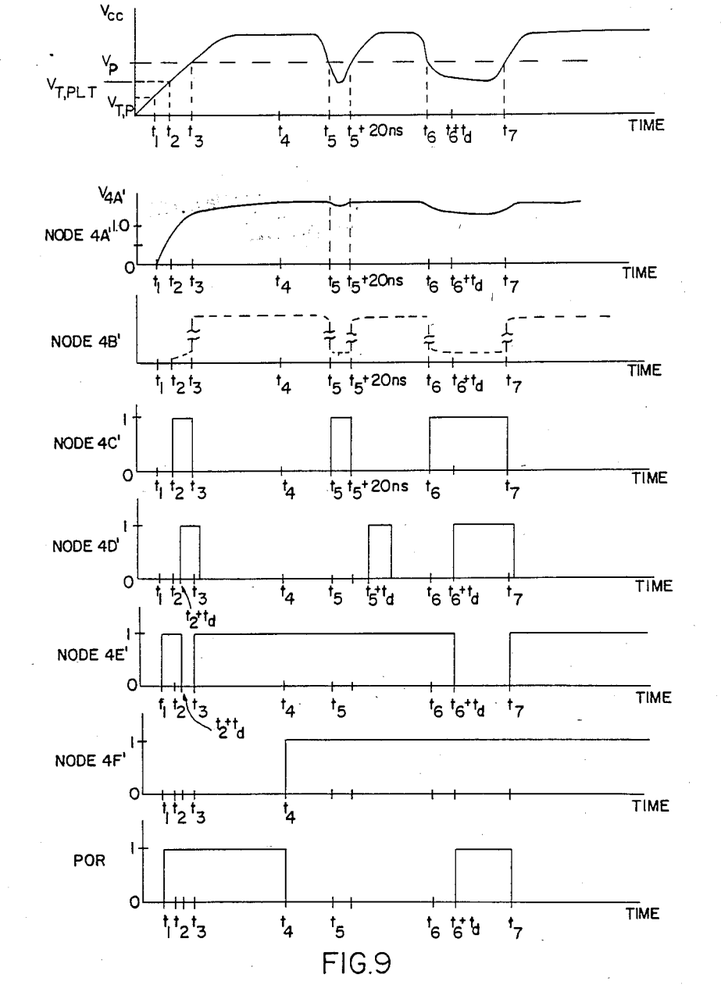
FIG. 9 illustrates the response of the level sensing power-on reset circuit for various changes in the power supply voltage level.

After the power supply voltage is first applied to the voltage sensing power-on reset circuit 200, a logic one signal is generated at node 1D and node 4E' at time $t_1$, as shown in FIG. 9, when the power supply voltage level reaches the threshold voltage of P channel enhancement mode transistor P3. Thus, at time $t_1$ the signal at node 4F' remains low and the signal at the output terminal POR goes high.

When the power supply voltage level reaches the threshold voltage of transistor P4A and the voltage at node 4A' starts to increase as shown in FIG. 9. As the power supply voltage level continues to increase, the threshold voltage of the unimplanted P channel enhancement mode transistor PLT3B is reached, at time $t_2$ as shown in FIG. 9 (transistor N9A is already ON producing a low signal on node 4B') and the signal at node 4C' starts to rise. At time $t_2 + t_d$, where $t_d$ is the delay time of the delay circuit 80, the output signal at node 4D' goes high and drives the signal at node 4E' low. However, the output signal on terminal POR remains unchanged because the signal at node 4F' was already low.

The times represented on the abscissa of FIG. 9 are not drawn to scale, but rather are drawn so as to clearly illustrate the change in signal levels at the various nodes. Thus FIG. 9 illustrates generally the direction in which the signal on node 4B' moves in response to changes in the level of the signal on node 4A'. However, the magnitudes of the high level signal and the low level signal on node 4B' is not known with any exactness, except it is known that the high level signal on node 4B' in general does not reach the magnitude of the high level signal on node 4C' and the low level signal on node 4B' in general does not drop to the magnitude of the low level signal on node 4C'. Indeed, the inverter 4-2B amplifies each signal swing on node 4B' to a rail to rail signal swing on node 4C'. The drawing in FIG. 4B' has been provided with break and dashed lines as shown to illustrate the lack of precise definition of the high and low level signals on node 4B'. The drawing of the waveform on node 4B' is provided merely to illustrate the relative positions of the signal at various times and the times at which the signal changes in level but is not drawn to scale.

Following time $t_3$ the power supply voltage level $V_{CC}$ exceeds the predetermined voltage $V_p$ and the trigger point of inverter 4-2A becomes greater than the trigger point of circuit element 4-1A. Therefore, the signal, as shown in FIG. 9, from circuit element 4-1A appears as a logic zero signal to inverter 4-2A after time $t_3$, and inverter 4-2A changes state such that the signal on node 4B' goes high. This change of state drives the signal at node 4C' low and the signal at node 4E' high, but the output signal on the output terminal of NAND gate 202 from circuit 200 remains unchanged because the output signal on node 4F' remains low.

As previously described, the power-on reset circuit 100 maintains the low output signal at node 4F' for a selected time usually on the order of 1 to 2 microseconds so as to allow the components in the integrated circuit containing the voltage sensitive power-on reset circuit 200 to stabilize. At the time $t_4$, the delay circuit 100-1 in power-on reset circuit 100 generates a voltage level on the input terminal of the secondary inverter 100-3 that drives the output signal from inverter 100-3 low. The low output signal from inverter 100-3 drives the output signal from inverter 40 in the initializing circuit 100-4 high which in turn drives the output signal from inverter 50 in initializing circuit 100-4 low. This low signal causes the output signal at node 4F' to go high. The high signal at node 4F' together with the high signal on node 4E' drives the signal at the terminal POR low.

The output signal on the output terminal POR of NAND gate 202 of the voltage sensing power-on reset circuit 200 remains unchanged after time $t_4$ unless the power supply voltage level $V_{CC}$ drops below the predetermined voltage $V_P$ defined by the trigger points of circuit element 4-1A and inverters 4-2A, 4-2B. As explained previously, the output signal from the power-on reset circuit 100 changes after the initial power-on cycle only if the power supply voltage level goes to ground. At time $t_5$, shown in FIG. 9, the power supply voltage level $V_{CC}$ dips below the predetermined voltage $V_p$.

When the power supply voltage $V_{CC}$ drops below the predetermined voltage $V_P$, the signal on node 4A' element 4-1A is greater than the trigger point for the inverters 4-2A, 4-2B, as illustrated in FIG. 5. Accordingly, the signal on node 4A', which is the input signal to the inverter 4-2A, appears as a logical one to inverter 4-2A and the inverter 4-2A triggers and the low signal on node 4B' generates a logic one signal at node 4C' after time $t_5$. The logic one signal on node 4C' does not arrive at node 4D' until the time $t_5+t_d$, where $t_d$ is the delay time of the delay circuit 80. Assume the dip in $V_{CC}$ below $V_P$ only lasts 20 nanoseconds. Then following time $t_5+20$ nanoseconds, the power supply voltage level $V_{CC}$ returns to a value greater than the predetermined voltage $V_p$. Thus, after time $t_5+20$ nanoseconds, the input signal to inverter 4-2A appears as a logical zero, because the trigger point for the inverter 4-2A is greater than output signal from circuit element 4-1A which is just the trigger point for circuit element 4-1A. Accordingly, the output signal on node 4B' from the inverter 4-2A goes high and the signal at node 4C' goes low immediately after time $t_5+20$ nanoseconds. Note that the signal on node 4E' has not changed in this 20 nanoseconds because of the 50 to 150 nanosecond time delay of delay circuit 80. Thus, after the time $t_5+t_d$ when the high signal arrives at node 4D', the signal on the node 4C' is low, because the delay time $t_d$ is greater than 20 nanoseconds. Hence, after time $t_5+t_d$ the output signal at node 4E' from the power supply voltage level sensing circuit 90 remains high and, as shown in FIG. 9, does not change.

At time $t_6$, in FIG. 9, the power supply voltage level $V_{CC}$ drops to the predetermined voltage $V_p$ and remains below that voltage until the time $t_7$. Time $t_7$ is greater than time $t_6+t_d$. For the reasons set forth above in conjunction with the dip in $V_{CC}$ at $t_5$ the decrease in the power supply voltage level $V_{CC}$ generates a logical one signal at node 4C' after time $t_6$ and a logical one signal at node 4D' after the time $t_6+t_d$. Thus, after time $t_6+t_d$, the signal at node 4E' goes to a logic zero level. The logic zero signal at node 4E' generates a logic one signal on the output terminal POR of the level sensing power-on reset circuit 200. The signal on output terminal POR remains high until after time $t_7$ when the power supply voltage increases above the predetermined voltage $V_p$ and the signal at node 4C' goes to a logic zero. The low logic signal at node 4C' drives the signal at node 4E' high which in turn drives the output signal on terminal POR low.

Hence, as shown in FIG. 9, voltage sensing power-on reset circuit 200 generates a first reset signal at time $t_1$, when the power supply voltage reaches the threshold voltage of a P channel enhancement mode transistor, which holds the components in the integrated circuit containing the reset circuit 200 in a known state. After the power supply voltage reaches its nominal operating level and the components in the integrated circuit have stabilized at time $t_4$, the delay circuit 100-1 in the power-on reset circuit 100 of the voltage sensing power-on reset circuit 200 causes the output signal on the node 4F' to go high which in conjunction with the high signal from the voltage sensing circuit 90 turns the reset signal off, i.e., drives the output signal on the terminal POR low. Accordingly, the voltage sensing power-on reset circuit 200 operates as a typical power-on reset circuit when the power supply voltage is first applied to the circuit 200.

However, unlike a typical power-on reset circuit, the voltage sensing power-on reset circuit 200 also generates a reset signal when the power supply voltage level falls below the predetermined voltage $V_p$ for a time period greater than the delay time $t_d$ of the filter circuit 80. Thus, after the power supply voltage has reached its nominal operating level, the voltage sensing power-on reset circuit 200 generates a signal that holds the components of the integrated circuit containing circuit 200 in a known state whenever the power supply voltage level falls such that the operation of the components becomes unreliable, but the voltage sensing power-on reset circuit 200 does not generate such a signal when the power supply voltage level decreases for such a short period of time that the operation of the components is not affected. Hence, the circuit of my invention provides a means for generating a reset signal if and only if the power supply voltage level is such that the components in the integrated circuit containing the power supply voltage level sensing circuit will not function reliably.

The power supply voltage level sensing circuit of my invention may be implemented in conjunction with other power-on reset circuits to create a level sensing power-on reset circuit in a matter similar to that described above. In addition, the power supply voltage level sensing circuit may be used with any integrated circuit to sense a general voltage level V and generate a first constant signal when the voltage level V is greater than the predetermined voltage $V_p$ of the power supply voltage level sensing circuit and a second constant signal, complementary to the first constant signal, when the voltage level V is less than the predetermined voltage $V_p$. Unlike the prior art, the power supply voltage level sensing circuit generates a signal whenever the power supply voltage level drops below a value which is critical for reliable operation of the integrated circuit containing the level sensing circuit.

While two embodiments of my invention have been disclosed, it should be understood that the present disclosure merely exemplifies the principles of the invention and is not intended to limit the invention to the embodiments illustrated. From the present disclosure, other embodiments and advantages of my invention will be apparent to one skilled in the art.

I claim:

1. A semiconductor device having a power supply voltage level sensing circuit comprising:

first means, having a power supply terminal and an output terminal, for providing a first output signal in response to the power supply voltage rising above a first selected value;

second means for receiving said first output signal and for providing a second output signal in response to the power supply voltage rising above a second selected value wherein;

said second output signal has a level greater than the level of said first output signal if said power supply voltage is greater than a third selected value and said second output signal has a level less than said level of said first output signal if said power supply voltage is less than said third selected value;

filter means, having an input terminal and an output terminal, for receiving said second output signal and generating a third output signal having a first value ifs aid second output signal has a first selected value and if said second output signal has a second selected value for less than a selected period of time, and having a second value if said second output signal has a second selected value for greater than said selected period of time.

2. A semiconductor device having a power supply voltage level sensing circuit as in claim 1 wherein said first means comprises:

a first transistor having a first drain/source connected to said power supply terminal, a gate connected to a reference voltage, and a second drain/source;

a second transistor having a first drain/source connected to said second drain/source of said first transistor, a second drain/source connected to said output terminal and a gate connected to said output terminal;

a third transistor having a first drain/source connected to said output terminal, a gate connected to said output terminal, and a second drain/source; and a fourth transistor having a first drain/source connected to said second drain/source of said third transistor, a gate connected to said first drain/source of said fourth transistor and a second drain/source connected to said reference voltage.

3. A semiconductor device having a power supply voltage level sensing circuit as in claim 2 wherein said first transistor and said second transistor are P channel enhancement mode transistors and said third transistor and said fourth transistor are N channel enhancement mode transistors.

4. A semiconductor device having a power supply voltage level sensing circuit as in claim 3 wherein said first selected value is determined by the threshold voltage of said first and said second P channel enhancement mode transistors.

5. A semiconductor device having a power supply voltage level sensing circuit as in claim 3 wherein said third selected value is determined by the ratio of the width to length ratio of said third transistor to the width to length ratio of said second transistor.

6. A semiconductor device having a power supply voltage level sensing circuit as in claim 5 wherein said ratio of the width to length ratio of said third transistor to the width to length ratio of said second transistor is greater than 100.

7. A semiconductor device having a power supply voltage level sensing circuit as in claim 1, further comprising means for turning off said first means and for providing a selected input signal to said second means.

8. A semiconductor device having a power supply voltage level sensing circuit as in claim 7 wherein said first means comprises:

a first transistor having a first drain/source connected to said power supply terminal, a gate connected to a first conductor, and a second drain/source;

a second transistor having a first drain/source connected to said second drain/source of said first transistor, a gate connected to said output terminal, and a second drain/source connected to said output terminal;

a third transistor having a first drain/source connected to said output terminal, a gate connected to said output terminal, and a second drain/source; and a fourth transistor having a first drain/source connected to said second drain/source of said third transistor, a gate connected to said first drain/source of said fourth transistor and a second drain/source connected to a reference voltage.

9. A semiconductor device having a power supply voltage level sensing circuit as in claim 8 wherein said means for turning off said first means and for providing said input signal to said second means comprises said first conductor and a fifth transistor, said fifth transistor having a first drain/source connected to said output terminal of said first means, a second drain/source connected to said reference voltage and a gate connected to said first conductor wherein when a selected voltage is applied to said first conductor, said first transistor of said first means is turned off and said fifth transistor is turned on.

10. A semiconductor device having a power supply voltage level sensing circuit as in claim 9 wherein said first transistor and said second transistor are P channel enhancement mode transistors and said third transistor, said fourth transistor, and said fifth transistor are N channel enhancement mode transistors.

11. A semiconductor device having a power supply voltage level sensing circuit as in claim 10 wherein said first selected value is determined by the threshold voltage of said first and said second P channel enhancement mode transistors.

12. A semiconductor device having a power supply voltage level sensing circuit as in claim 10 wherein said third selected value is determined by the ratio of the width to length ratio of said third transistor to the width to length ratio of said second transistor.

13. A semiconductor device having a power supply voltage level sensing circuit as in claim 12 wherein said ratio of the width to length ratio of said third transistor to the width to length ratio of said second transistor is greater than 100.

14. A semiconductor device as in claim 1 wherein said filter means comprises:
- an inverter which receives said second output signal and provides the complement of said second output signal;
- a NAND gate having a first input terminal, a second input terminal and an output terminal, said output terminal providing said third output signal;
- a conductor which provides said complement of said second output signal to said first input terminal of said NAND gate;
- a delay circuit having an input terminal, an output terminal and a time constant equal to said selected period of time, wherein said input lead of said delay circuit receives said complement of said second output signal and after said selected period of time provides said complement of said second output signal to said second input terminal of said NAND gate;
- whereby said NAND gate provides a logical zero output signal as said third output signal only if said second output signal remains a logical zero continuously for at least said selected period of time.

15. A semiconductor device having a power supply voltage level sensing circuit as in claim 14 wherein said second means comprises a first CMOS inverter and said inverter of said filter means comprises a second CMOS inverter, each of said CMOS inverters having an input lead and an output lead wherein:
- said input lead of said first CMOS inverter receives said first output signal;
- said output lead of said first CMOS inverter is tied to said input lead of said second CMOS inverter; and
- said complement of said second output signal is provided on said output lead of said second CMOS inverter.

16. A semiconductor device having a power supply voltage level sensing circuit as in claim 15 wherein:
- each of said CMOS inverters comprises an unimplanted P channel enhancement mode transistor and an N channel enhancement mode transistor; and
- said second selected value is the threshold voltage of said unimplanted P channel enhancement mode transistor of said first inverter.

17. A semiconductor device having a power supply voltage level sensing circuit as in claim 1 wherein said filter means comprises:
- a conductor having a first end connected to said input terminal of said filter means;
- a logic gate having a first input terminal, a second input terminal and an output terminal wherein a second end of said conductor is connected to said first input terminal of said logic gate and said output terminal of said logic gate is said output terminal of said filter means;
- a delay circuit having an input lead, an output lead and a time constant, wherein said input lead of said delay circuit is connected to said input terminal of said filter means and said output lead of said delay circuit is connected to said second input terminal of said logic gate; and further wherein
- said time constant of said delay circuit is said selected time period.

18. A semiconductor device having a power supply voltage level sensing circuit as in claim 17 wherein said delay circuit comprises:
- a first CMOS inverter having an input terminal and an output terminal, said input terminal of said first CMOS inverter being connected to said input lead of said delay circuit;
- a resistive means having a first lead and a second lead, said first lead being connected to said output terminal of said first CMOS inverter;
- a first capacitive means having a first plate and a second plate, said first plate being connected to said second lead of said resistive means and said second plate being connected to a reference voltage;
- a second CMOS inverter having an input terminal and an output terminal, said input terminal being connected to said first plate of said first capacitive means; and
- a second capacitive means having a first plate and a second plate, said first plate being connected to said power supply voltage and said second plate being connected to said output terminal of said second CMOS inverter and to said output lead of said delay circuit.

19. A semiconductor device having a power supply voltage level sensing circuit as in claim 18 wherein
- said first CMOS inverter comprises a P channel enhancement mode transistor and an N channel enhancement mode transistor;
- said second CMOS inverter comprises an unimplanted P channel enhancement mode transistor and a N channel enhancement mode transistor; and
- said resistive means comprises an N channel enhancement mode transistor having a first drain/source connected to said first lead of said resistive means, a second drain/source connected to said second lead of said resistive means and a gate connected to said power supply voltage.

20. A semiconductor device having a power supply voltage level sensing circuit as in claim 18 wherein
- said first CMOS inverter and said second CMOS inverter each comprise a P channel enhancement mode transistor and an N channel enhancement mode transistor; and
- said resistive means comprises a transmission gate having an input terminal and an output terminal wherein said input terminal of said transmission gate is connected to said first lead of said resistive means and said output terminal of said transmission gate is connected to said second lead of said resistive means.

21. A reset circuit comprising:
- a power-on reset circuit having a power supply terminal for receiving a power supply voltage and an output terminal wherein said power-on reset circuit provides a first output signal on said output terminal in response to said power supply voltage rising above a first selected value and a second output signal complementary to said first output signal a first selected time period after said first output signal is provided;
- a power supply voltage level sensing circuit having an output terminal, said power supply voltage level sensing circuit comprising:
  - first means, having a power supply terminal and an output terminal for providing a third output signal in response to said power supply voltage rising above a second selected value;
  - second means for receiving said third output signal and for providing a fourth output signal in response to said power supply voltage rising above a third selected value; wherein said fourth output signal has a level greater than the level of said third output signal if said power supply voltage is greater than a fourth selected value and said fourth output signal has a level less than said level of said third output signal if said power supply voltage is less than said fourth selected value;

filter means, having an input terminal for receiving said fourth output signal and an output terminal for providing a fifth output signal having a first value if said fourth output signal has a first selected value and if said fourth output signal has a second selected value for less than a second selected period of time, and having a second value if said fourth output signal has a second selected value for greater than said second selected period of time; and a logic gate having a first input terminal connected to said output terminal of said power-on reset circuit, a second input terminal connected to said output terminal of said filter means and an output terminal providing an output signal from said reset circuit.

22. A reset circuit as in claim 21 wherein said first means comprises:

a first transistor having a first drain/source connected to said power supply terminal, a gate connected to a reference voltage, and a second drain/source;

a second transistor having a first drain/source connected to said second drain/source of said first transistor, a gate connected to said output terminal, and a second drain/source connected to said output terminal; and a third transistor having a first drain/source connected to said output terminal, a gate connected to said output terminal, and a second drain/source; and a fourth transistor having a first drain/source connected to said second drain/source of said third transistor, a gate connected to said first drain/source of said fourth transistor and a second drain/source connected to said reference voltage.

23. A reset circuit as in claim 22 wherein said first transistor and said second transistor are P channel enhancement mode transistors and said third transistor and said fourth transistor are N channel enhancement mode transistors.

24. A reset circuit as in claim 23 wherein said second selected value is determined by the threshold voltage of said first and said second P channel enhancement mode transistors.

25. A reset circuit as in claim 23 wherein said fourth selected value is determined by the ratio of the width to length ratio of said third transistor to the width to length ratio of said second transistor.

26. A reset circuit as in claim 25 wherein said ratio of the width to length ratio of said third transistor to the width to length ratio of said second transistor is greater than 100.

27. A reset circuit as in claim 21, further comprising means for turning off said first means and for providing an input signal to said second means.

28. A reset circuit as in claim 27 wherein said first means comprises:

a first transistor having a first drain/source connected to said power supply terminal, a gate connected to a first conductor, and a second drain/source;

a second transistor having a first drain/source connected to said second drain/source of said first transistor, a gate connected to said output terminal, and a second drain/source connected to said output terminal;

a third transistor having a first drain/source connected to said output terminal, a gate connected to said output terminal, and a second drain/source; and a fourth transistor having a first drain/source connected to said second drain/source of said third transistor, a gate connected to said first drain/source of said fourth transistor and a second drain/source connected to a reference voltage.

29. A reset circuit as in claim 28 wherein said means for turning off said first means and for providing said input signal to said second means comprises said first conductor and a fifth transistor, said fifth transistor having a first drain/source connected to said output terminal of said first means, a second drain/source connected to said reference voltage and a gate connected to said first conductor wherein when a selected voltage is applied to said first conductor, said first transistor of said first means is turned off and said fifth transistor is turned on.

30. A reset circuit as in claim 29 wherein said first transistor and said second transistor are P channel enhancement mode transistors and said third transistor, said fourth transistor, and said fifth transistor are N channel enhancement mode transistors.

31. A reset circuit as in claim 30 wherein said second selected value is determined by the threshold voltage of said first and said second P channel enhancement mode transistors.

32. A reset circuit as in claim 30 wherein said fourth selected value is determined by the ratio of the width to length ratio of said third transistor to the width to length ratio of said second transistor.

33. A reset circuit as in claim 32 wherein said ratio of the width to length ratio of said third transistor to the width to length ratio of said second transistor is greater than 100.

34. A reset circuit as in claim 21 wherein said filter means comprises:

an inverter which receives said fourth output signal and provides the complement of said fourth output signal;

a NAND gate having a first input terminal, a second input terminal and an output terminal, said output terminal providing said fifth output signal;

a conductor which provides said complement of said fourth output signal to said first input terminal of said NAND gate;

a delay circuit having a time constant equal to said second selected period of time, wherein said delay circuit receives said complement of said fourth output signal and after said second selected period of time provides said complement of said fourth output signal to said second input terminal of said NAND gate;

whereby said NAND gate provides a logical zero output signal as said fifth output signal only if said fourth output signal remains a logical zero continuously for at least said second selected period of time.

35. A reset circuit as in claim 34 wherein said second means comprises a first CMOS inverter and said inverter of said filter means comprises a second CMOS inverter, each of said CMOS inverters having an input lead and an output lead wherein:
said input lead of said first CMOS inverter receives said third output signal;
said output lead of said first CMOS inverter is tied to said input lead of said second CMOS inverter; and
said complement of said fourth output signal is provided on said output lead of said second CMOS inverter.

36. A reset circuit as in claim 35 wherein;
each of said CMOS inverters comprises an unimplanted P channel enhancement mode transistor and an N channel enhancement mode transistor; and
said third selected value is the threshold voltage of said unimplanted P channel enhancement mode transistor.

37. A reset circuit as in claim 21 wherein said filter means comprises:
a conductor having a first end connected to said input terminal of said filter means;
a logic gate having a first input terminal, a second input terminal and an output terminal wherein a second end of said conductor is connected to said first input terminal of said logic gate and said output terminal of said logic gate is said output terminal of said filter means;
a delay circuit having an input lead, an output lead and a time constant, wherein said input lead of said delay circuit is connected to said input terminal of said filter means and said output lead of said delay circuit is connected to said second input terminal of said logic gate; and further wherein
said time constant of said delay circuit is said second selected time period.

38. A reset circuit as in claim 37 wherein said delay circuit comprises:
a first CMOS inverter having an input terminal and an output terminal, said input terminal of said first CMOS inverter being connected to said input lead of said delay circuit;
a resistive means having a first lead and a second lead, said first lead being connected to said output terminal of said first CMOS inverter;
a first capacitive means having a first plate and second plate, said first plate being connected to said second lead of said resistive means and said second plate being connected to a reference voltage;
a second CMOS inverter having an input terminal, and an output terminal, said input terminal being connected to said first plate of said first capacitive means; and
a second capacitive means having a first plate and a second plate, said first plate being connected to said power supply voltage and said second plate being connected to said output terminal of said second CMOS inverter and to said output lead of said delay circuit.

39. A reset circuit as in claim 38 wherein
said first CMOS inverter comprises a P channel enhancement mode transistor and an N channel enhancement mode transistor;
said second CMOS inverter comprises an unimplanted P channel enhancement mode transistor and an N channel enhancement mode transistor; and
said resistive means comprises an N channel enhancement mode transistor having a first drain/source connected to said first lead of said resistive means, a second drain/source connected to said second lead of said resistive means and a gate connected to said power supply voltage.

40. A reset circuit as in claim 38 wherein
said first CMOS inverter and said second CMOS inverter each comprise a P channel enhancement mode transistor and an N channel enhancement mode transistor; and
said resistive means comprises a transmission gate having an input terminal and an output terminal wherein said input terminal of said transmission gate is connected to said first lead of said resistive means and said output terminal of said transmission gate is connected to said second lead of said resistive means.

41. A reset circuit which comprises:
means for sensing when a power supply voltage is applied to a circuit and for providing a first output signal of a first selected time in response thereto; and
means for sensing when said power supply voltage drops beneath a selected value for a time period in excess of a second selected time and for generating a second output signal in response thereto;
means for receiving said first and second output signals, and in response to receiving either of said first and second output signals, providing a reset signal during the time period when either of said first and second output signals is being received.

42. A reset circuit as in claim 41 in which said means for sensing when a power supply voltage is applied to a circuit and for providing a first output signal of said first selected time comprises a power-on reset circuit which provides said first output signal for said first selected time in response to said power supply voltage rising above a first selected level and after said first selected time has passed providing a signal complementary to said first output signal.

43. A reset circuit as in claim 42 in which said power-on reset circuit comprises:
a delay circuit, responsive to said supply voltage for providing a first intermediate signal, said delay circuit comprising:
a resistive means having an output terminal and an input terminal to which said power supply voltage is applied, wherein said resistive means conducts if and only if said power supply voltage rises above a second selected level, and wherein said first intermediate signal is provided to said output terminal of said resistive means after said supply voltage rises above said second selected level; and
a capacitor having a first and a second plate, said first plate of said capacitor being connected to said output terminal of said resistive means, said second plate of said capacitor being connected to a reference voltage; and
an initializing circuit providing said first output signal in response to said supply voltage rising above said first selected level after receiving said first intermediate signal;
wherein said first intermediate signal rises above a third selected value on said output terminal of said resistive means said first selected time after said supply voltage rises above said first selected value such that after said first selected time said initializing circuit provides said signal complementary to said first output signal.

44. A reset circuit as in claim 41 in which said means for sensing when said power supply voltage drops beneath a selected value for a time period in excess of said second selected time and for generating a second output signal comprises:
   first means, having a power supply terminal and a first means output terminal, for providing a first means output signal in response to said power supply voltage rising above a second selected value;
   second means for receiving said first means output signal and for providing a second means output signal in response to the power supply voltage rising above a third selected value, wherein said second means output signal has a level greater than the level of said first means output signal if said power supply voltage is greater than a fourth selected value and said second means output signal has a level less than said level of said first means output signal if said power supply voltage is less than said fourth selected value; and
   filter means for receiving said second means output signal and generating said second output signal having a first value if said second means output signal has a first selected value or if said second means output signal has a second selected value for less than said second selected time, and having a second value if said second means output signal has a second selected value for greater than said second selected time.

45. A reset circuit as in claim 44 wherein said filter means comprises:
   an inverter which receives said second means output signal and provides the complement of said second means output signal;
   a NAND gate having a first input terminal, a second input terminal and an output terminal, said output terminal providing said second output signal;
   a conductor which provides said complement of said second means output signal to said first input terminal of said NAND gate;
   a delay circuit having an input terminal, an output terminal and a time constant equal to said second selected time, wherein said input lead of said delay circuit receives said complement of said second means output signal and after said second selected time provides said complement of said second means output signal to said second input terminal of said NAND gate;
   whereby said NAND gate provides a logical zero output signal as said second output signal only if said second means output signal remains a logical zero continuously for at least said second selected time.

46. A reset circuit as in claim 45 wherein said delay circuit comprises at least two inverters, at least one capacitive means and at least one resistive means connected in series.

47. A reset circuit as in claim 46 wherein said delay circuit comprises a first inverter having its input terminal connected to receive said complement of said second means output signal, resistive means comprising an N channel transistor having a first drain/source connected to the output terminal of said first inverter and a control terminal connected to receive said power supply voltage, capacitive means comprising a transistor having both drain/source terminals connected to a reference voltage and a control terminal connected to a second drain/source of said N channel transistor, a second inverter having its input terminal connected to said second drain/source of said N channel transistor, and capacitive means comprising a transistor having both drain/source terminals connected to receive said power supply voltage and a control terminal connected to an output terminal of said second inverter, said output terminal of said second inverter also being connected to said output terminal of said delay circuit.

48. A reset circuit as in claim 44 wherein said filter means comprises:
   a logic gate having a first input terminal, a second input terminal and an output terminal, said output terminal providing said second output signal;
   a conductor which provides said second means output signal to said first input terminal of said logic gate;
   a delay circuit having an input terminal, an output terminal and a time constant equal to said second selected time, wherein said input lead of said delay circuit receives said second means output signal and after said second selected time provides said second means output signal to said second input terminal of said logic gate;
   whereby said logic gate provides said reset signal as said second output signal only if said second means output signal remains a logical zero continuously for at least said second selected time.

49. A reset circuit as in claim 41 in which said means for receiving said first and second output signals and providing a reset signal comprises a NAND gate.

* * * * *

UNITED STATES PATENT AND TRADEMARK OFFICE
CERTIFICATE OF CORRECTION

PATENT NO. : 4,902,910

DATED : Feb. 20, 1990

INVENTOR(S) : Hung-Cheng Hsieh

It is certified that error appears in the above-identified patent and that said Letters Patent is hereby corrected as shown below:

Col. 9, line 43, delete "32".

Col. 15, line 32, "ifs aid" should read --if said--.

Signed and Sealed this

Twenty-third Day of July, 1991

Attest:

HARRY F. MANBECK, JR.

Attesting Officer

Commissioner of Patents and Trademarks